(12) United States Patent
Kwan

(10) Patent No.: US 11,004,216 B2
(45) Date of Patent: May 11, 2021

(54) MACHINE LEARNING BASED OBJECT RANGE DETECTION

(71) Applicant: The Boeing Company, Chicago, IL (US)

(72) Inventor: Kenny G. Kwan, Cypress, CA (US)

(73) Assignee: THE BOEING COMPANY, Chicago, IL (US)

( * ) Notice: Subject to any disclaimer, the term of this patent is extended or adjusted under 35 U.S.C. 154(b) by 43 days.

(21) Appl. No.: 16/393,675

(22) Filed: Apr. 24, 2019

(65) Prior Publication Data

US 2020/0342612 A1     Oct. 29, 2020

(51) Int. Cl.
| | |
|---|---|
| *G06F 30/20* | (2020.01) |
| *G06T 7/246* | (2017.01) |
| *G06N 3/08* | (2006.01) |
| *G06N 3/04* | (2006.01) |

(52) U.S. Cl.
CPC .............. *G06T 7/251* (2017.01); *G06F 30/20* (2020.01); *G06N 3/0481* (2013.01); *G06N 3/084* (2013.01); *G06T 2207/10032* (2013.01)

(58) Field of Classification Search
CPC ....... G06T 7/251; G06F 30/20; G06N 3/0481; G06N 3/084
See application file for complete search history.

(56) References Cited

U.S. PATENT DOCUMENTS

| | | | |
|---|---|---|---|
| 9,904,875 B2 | 2/2018 | Szegedy et al. | |
| 2002/0052805 A1* | 5/2002 | Seki | G06Q 30/02 705/27.2 |
| 2009/0060273 A1* | 3/2009 | Stephan | G06K 9/00805 382/103 |
| 2017/0265750 A1* | 9/2017 | Iizuka | A61B 5/0095 |
| 2019/0026917 A1* | 1/2019 | Liao | G06K 9/4628 |

FOREIGN PATENT DOCUMENTS

WO     2015/011688 A2     1/2015

* cited by examiner

*Primary Examiner* — Sam Bhattacharya
(74) *Attorney, Agent, or Firm* — MH2 Technology Law Group LLP

(57) ABSTRACT

A computer-implemented method may include: storing, by the computing device, information linking a dataset associated with a simulated image with an object range truth; receiving, by the computing device, an operational image from an observation system, wherein the operational image comprises the object; determining, by the computing device, a range of the object from the operational image based on the simulated image and the object range truth; and executing, by the computing device, a computer-based instruction based on the range of the object.

20 Claims, 7 Drawing Sheets

MACHINE LEARNING BASED OBJECT RANGE DETECTION

BACKGROUND

Celestial observation systems, such as satellites, may capture data and/or images of objects within a particular detection range. Observation systems may implement radar, laser, stereo passive observation, orbit determination algorithms, and/or other types of systems, devices, and techniques to estimate range of observed objects. Accurate object range detection is used to support charting, exploration, collision avoidance, or the like.

Existing object range detection techniques require the use of relatively costly and large hardware, which is of particular concern when an observation system is implemented on spacecraft having limited size, weight, and power capacity. Moreover, existing software-based object range techniques (e.g., orbit determination algorithms) may be relatively slow to converge to a usable solution.

SUMMARY

In one example aspect, a computer-implemented method may include: storing, by the computing device, information linking a dataset associated with a simulated image with an object range truth; receiving, by the computing device, an operational image from an observation system, wherein the operational image comprises the object; determining, by the computing device, a range of the object from the operational image based on the simulated image and the object range truth; and executing, by the computing device, a computer-based instruction based on the range of the object.

In another example aspect, there is a computer program product including a computer readable storage medium having program instructions embodied therewith. The program instructions are executable by a computing device to cause the computing device to: store plurality of datasets linked to respective object range truths as part of a neural network; determine an object range of an object detected by a sensor and included in an operational image using the neural network; and execute a computer-based instruction based on the object range.

In another example aspect, a system includes: a processor, a computer readable memory and a computer readable storage medium associated with a computing device; program instructions to receive an operational image from an observation system, wherein the operational image comprises an object; program instructions to extract a dataset from the operational image; program instructions to identify a particular dataset in a neural network that substantially matches the extracted dataset; program instructions to determine a range of the object from the operational image based on an object range truth associated with the particular dataset; and execute a computer-based instruction based on the range of the object. The program instructions are stored on the computer readable storage medium for execution by the processor via the computer readable memory.

DETAILED DESCRIPTION

Figure 1A:
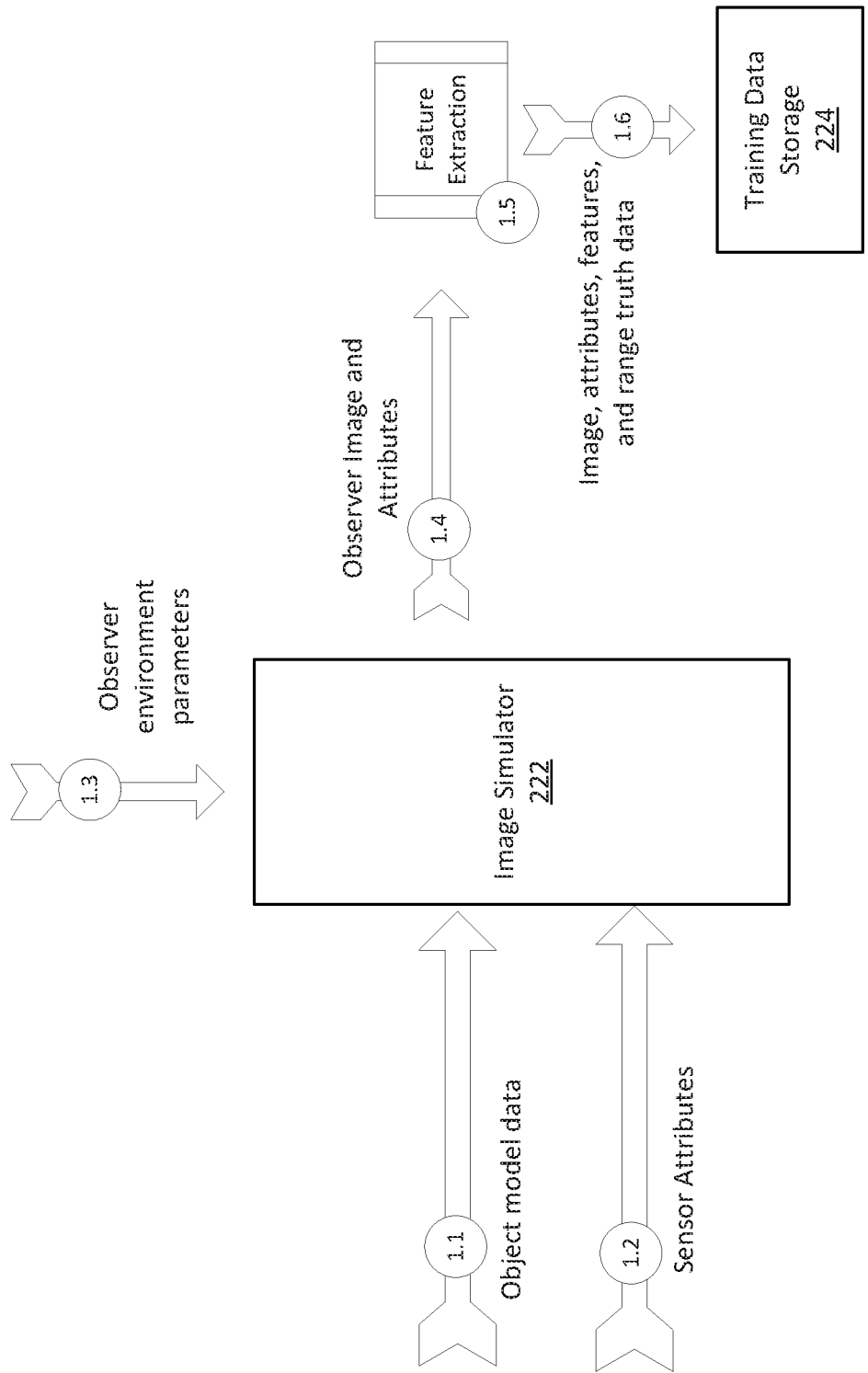
FIG. 1A illustrates an example overview of a process for generating training data to be used to train a neural network and a predictor to be used to detect object range.

Accurate object range detection by an object observation system is used to support charting/exploration, collision avoidance, or the like. Existing object range detection techniques require the use of relatively costly and large hardware, which is of particular concern when an observation system is implemented on spacecraft having limited size, weight, and power capacity. Moreover, existing software-based object range techniques (e.g., orbit determination algorithms) may be relatively slow to converge to a usable solution. Accordingly, systems and/or methods, described herein, may implement machine learning, regression predictors, and/or deep neural networks to improve object range detection without the need of additional hardware on a spacecraft carrying and observation system.

In embodiments, the systems and/or methods may train a neural network to estimate the range of an object based on one or more training images. The neural network range estimator may be used as a standalone system to estimate object range, and may also be used to supplement other range detection techniques, such as cases where an object is just beyond a radar or laser ranger's detection range. In accordance with aspects of the present disclosure, a neural network range estimator and predictor may improve range estimation without the use of additional hardware. For example, systems and/or methods in accordance with aspects of the present disclosure may be implemented in a small cubesat with an existing optical sensor, thereby giving the cubesat range detection capability without the need to implement or add additional hardware. The systems and/or methods may also provide additional measurements to accelerate the solution convergence of orbit determination algorithms. For example, the systems and/or methods may provide the capability to include the additional dimension of range that may accelerate orbit determination.

As described herein, the systems and/or methods may generate training data for training a neural network for regression. Neural network regression may be used to predict the range of an object observed by an observation system (e.g., satellite or other type of observer). In some implementations, the neural network may be developed and trained using machine learning techniques. Neural network regression may be trained by inputting object image data with a "truth," which is a known range value. Multiple object images may be associated with different truth range values to continually train the neural network. In operation, image data from a sensor implemented by an observation system may be received, and processed through the neural network in order to determine a range value. As an example, image data processed through a neural network may be sourced from a sensor implemented in a real-time object range detection operation. Since the processed image data used to train a neural network is associated with a truth, the known object range, the range of the object present in an image captured in a real-time operation is determined based on the truth range associated with the matched training image data used to train the neural network. In other words, object range predicted from image data can be determined from neural network regression. Further, proper neural network weights are applied to more accurately refine the range prediction.

Certain embodiments of the disclosure will hereafter be described with reference to the accompanying drawings, wherein like reference numerals denote like elements. It should be understood, however, that the accompanying drawings illustrate only the various implementations described herein and are not meant to limit the scope of various technologies described herein. The drawings show and describe various embodiments of the current disclosure.

Embodiments of the disclosure may include a system, a method, and/or a computer program product at any possible technical detail level of integration. The computer program product may include a computer readable storage medium (or media) having computer readable program instructions thereon for causing a processor to carry out aspects of the present disclosure.

FIG. 1A illustrates an example overview of a process for generating training data to be used to train a neural network and a predictor to be used to detect object range. As described with respect to FIG. 1A, an image simulator 222 may execute a simulation to generate an image of a given object when the object is observed using a sensor implemented by an observation system (e.g., a satellite and/or other type of observation system). As described in greater detail herein, the simulated image is used as training data and is associated with a range truth, the known range. As described in greater detail herein, when the simulated image substantially matches an image captured in real operation (e.g., an operational image), the range of the object in the operational image is identified as the range truth associated with the simulated image.

At steps 1.1 and 1.2, object model data and sensor attributes are inputted into an image simulator 222. The object model data may include a computer-aided design (CAD) model or other type of computer-generated model of an object. In some implementations, the object model data may include information identifying object dimensions, surface reflectivity, and/or other data relating to an object. The sensor attributes may include information identifying a type of sensor, aperture, focal length, instantaneous field of view (iFOV), pixel pitch, pixel size, charge-couple device (CCD) well size, saturation limit, quantum efficiency, dark current, noise levels, and/or other attributes of a sensor that may be implemented by an observation system. At step 1.3, the image simulator 222 receives observer environment parameters, such as sensor integration time, observer position and velocity, observer attitude during imaging, target position and velocity, sun position, and/or other environmental parameters.

At step 1.4, the image simulator 222 may execute a simulation to generate a simulated observer image and a set of attributes associated with the image. As described herein, the simulated observer image generated by image simulator 222 may include a simulation of an image that would be produced by a sensor having a set of attributes (e.g., from step 1.2) when the sensor observes the object (e.g., from step 1.1) and when the observation system that implements the sensor is operating under set of environmental conditions/parameters (e.g., from step 1.3). In some implementations, the attributes associated with the image may include observer position, observer attitude, or the like. At step 1.5, features from the image are extracted (e.g., object intensity, solar phase angle, or the like). Additionally, the object range truth is extracted. Alternatively, the object range truth may be predetermined. At step 1.6, the image, attributes, features, and range truth data are saved in a training data storage 224.

The process shown in FIG. 1A may be repeated for different sets of inputs. In this way, the training data storage 224 may store multiple sets of training data in which each training dataset identifies an image of a given object when the object is observed by a sensor having a given set of attributes and when operating under a given set of conditions.

In embodiments, a simulator need not be used, and some other training process may be used, the end result being that the training data storage 224 stores multiple sets of training data. For example, previously captured training images having an image of an object associated with a range truth and captured by a sensor having a given set of attributes and operating under a given set of operating conditions may be stored in the training data storage 224. In other words, the use of the image simulator 222 is one example technique for generating training data, and other examples are possible. However, the use of the image simulator 222, as described with respect to FIG. 1A, allows for the generation of numerous training datasets with numerous different sets of inputs in a relatively short amount of time.

Figure 1B:
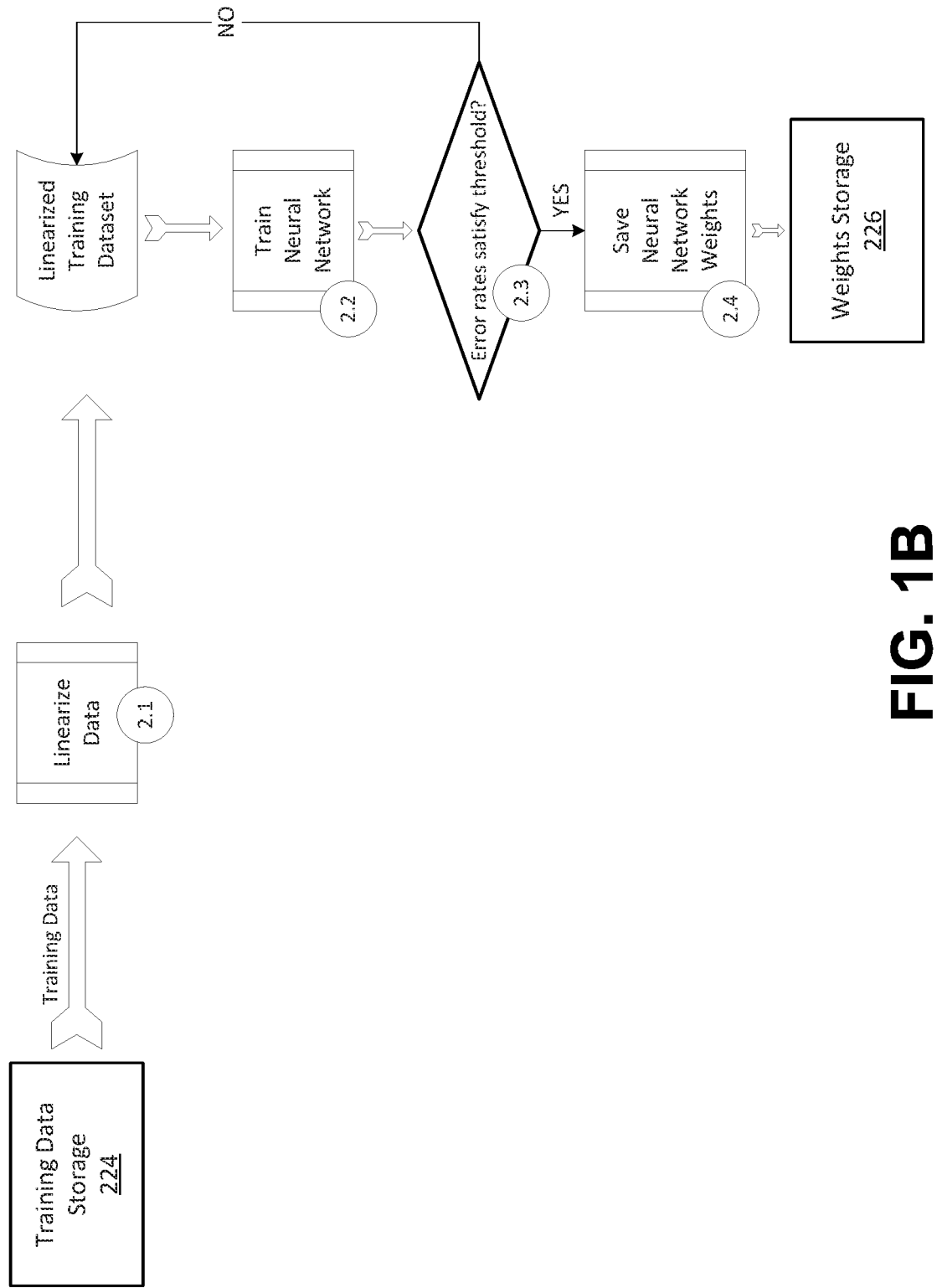
FIG. 1B illustrates an example back propagation process for training a neural network based on the generated training data.

FIG. 1B illustrates an example back propagation process for training a neural network based on the generated training data. At step 2.1, multiple training data sets stored by the training data storage 224 (e.g., generated in accordance with the process of FIG. 1A) are linearized. At step 2.2, a neural network is trained in which the neural network includes multiple training datasets. Each training dataset includes an image of an object captured by a sensor having a given set of attributes and operating under a given set of conditions. As part of the neural network training, error rates of the training datasets are determined. The error rate of a training dataset may be determined, for example, using back propagation. For example, the error rate may be determined by accessing the training dataset, using the neural network to determine a range value, and comparing the determined range value with a range truth. The discrepancy between the determined range value and the range truth may represent the error rate. If, at step 2.3, the error rate does not satisfy a threshold (step 2.3—NO), the weights of the neural network are adjusted to bias the neural network output towards the correct truth value. If the error rate now satisfies the threshold, (step 2.3—YES), the weight for that training data set is saved (e.g., at step 2.4 in a weights storage 226). Using an example algebraic expression as an illustrative example, such as the equation:

$$y = m^*x + B \qquad (1)$$

y represents the range truth, x represents a dataset including the image features, sensor attributes, observer environment parameters, and/or the sensor operating parameters, and m and B, correspond to the weights that may be determined via back propagation. The process of FIG. 1B may be repeated for each training data set and each determined weight may be saved in the weights storage 226. Using the algebraic expression as an illustrative example (e.g., equation 1), different weights may be determined for different values of x (e.g., different image features, sensor attributes, sensor operating parameters, etc.) In this way, neural network regression is trained for determining object range from image data and different weights may be used for different types of sensors and/or observation systems.

Figure 1C:
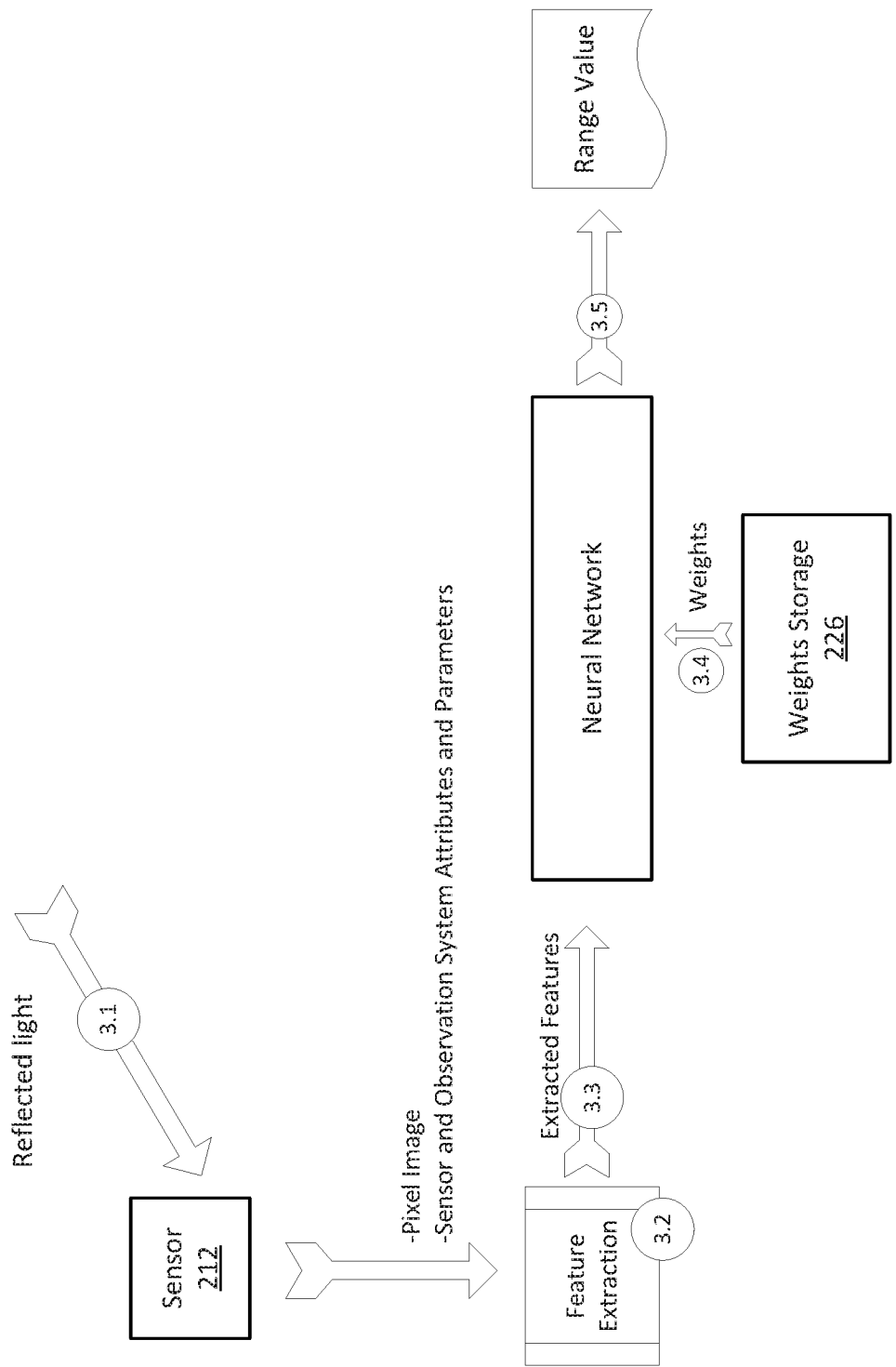
FIG. 1C illustrates an example process of using the training data and the trained neural network and predictor in operation to detect object range from an operational image.

FIG. 1C illustrates an example process of using the training data and the trained neural network and predictor in operation to detect object range from an operational image. At step 3.1, a sensor 212 may observe reflected light (e.g., in which the reflected light includes an object whose range is to be detected). The sensor may produce a pixel image of the viewed object. At step 3.2, features are extracted from the image. Also, sensor and observation system attributes and parameters are extracted (such as those described above with respect to steps 1.2 and 1.3) and input into the neural network. At step 3.4, the weightings are input to the neural network. Based on the weightings and the extracted features, attributes, and parameters, the range value is determined and output (e.g., at step 3.5). More specifically, the extracted features, attributes, and parameters from step 3.3 are correlated as a range value. For example, the extracted features, attributes, and parameters from step 3.3 are processed in the neural network producing a range prediction. In this way, the image, gathered by the sensor 212 in an operational setting, is processed into a numerical value representing the range of the object relative to the sensor.

Figure 2:
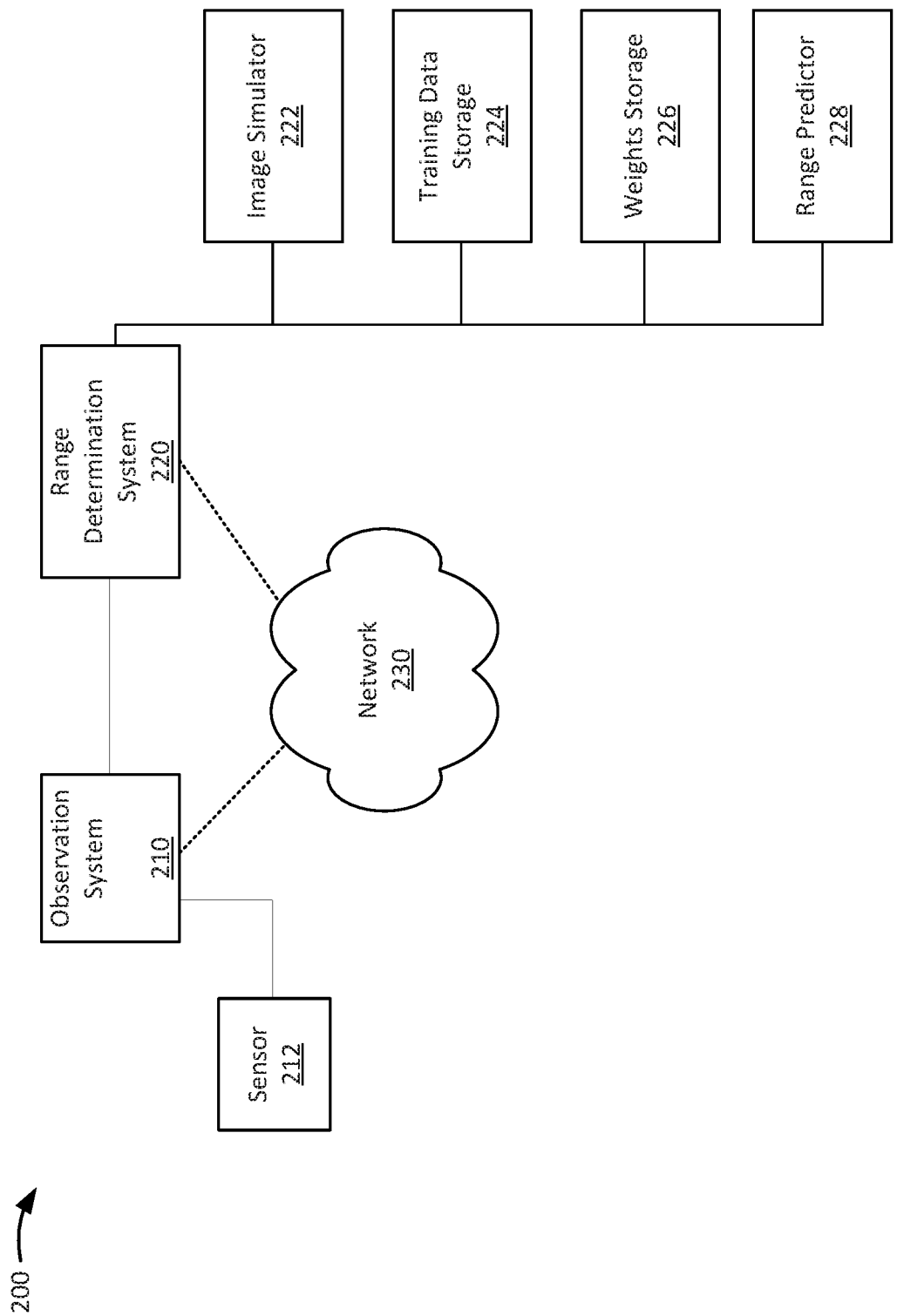
FIG. 2 shows an example environment in which one or more processes of an embodiment of the invention may be implemented.

FIG. 2 shows an example environment in accordance with aspects of the present disclosure. As shown in FIG. 2, environment 200 includes an observation system 210, a range determination system 220, and a network 230.

The observation system 210 includes one or more satellites, aircraft, or other type of observation system for observing an area (e.g., an area of airspace, celestial space, etc.). In one or more alternative embodiments, the observation system 210 may include a vehicular observer implemented on a ground vehicle. Additionally, or alternatively, the observation system 210 may include a fixed observer, such as a tower. As shown in FIG. 2, the observation system 210 may include a sensor 212. The sensor 212 may include a camera, object detection sensor, heat sensor and/or any suitable sensor (or combination of multiple sensors) designed to be implemented in the observation system 210 (e.g., for obtaining observation data for an area for charting, exploration, collision avoidance, etc.).

The range determination system 220 may include one or more devices and/or software modules to detect the range of an object viewed by the observation system 210. As shown in FIG. 2, the range determination system 220 may include an image simulator 222, a training data storage 224, a weights storage 226, and a range predictor 228. The image simulator 222 may generate simulated images as part of a training data generation process (e.g., as described with respect to FIG. 1A). In some implementations, the training data storage 224 may store the generated training data. The weights storage 226 may store information identifying weights to apply an initial range determination (e.g., to refine the range determination). As described herein, the weightings may be determined as part of a weighted neural network regression training process described with respect to FIG. 1B. In some implementations, the range predictor 228 may include a predictor that receives, as input, image data, extracted image features, sensor attributes, and/or sensor operating conditions, and predicts the input as a range value representing a range of an object relative to the sensor 212 that observed or viewed the object. The range predictor 228 may apply the weight stored by the weights storage 226 to accurately determine the range.

In some implementations, the observation system 210 and the range determination system 220 may be integrated together. For example, the range determination system 220 may include stand-alone computing hardware and software for detecting the range of an object viewed by the observation system 210. Alternatively, the range determination system 220 may include a software module implemented within existing computing hardware implemented in the observation system 210. In some implementations, the range determination system 220 may include a stand-alone system located remote from the observation system 210.

The network 230 may include one or more wired and/or wireless networks. For example, the network 230 may include a cellular network (e.g., a second generation (2G) network, a third generation (3G) network, a fourth generation (4G) network, a fifth generation (5G) network, a long-term evolution (LTE) network, a global system for mobile (GSM) network, a code division multiple access (CDMA) network, an evolution-data optimized (EVDO) network, or the like), a public land mobile network (PLMN), and/or another network. Additionally, or alternatively, the network 230 may include a local area network (LAN), a wide area network (WAN), a metropolitan area network (MAN), the Public Switched Telephone Network (PSTN), an ad hoc network, a managed Internet Protocol (IP) network, a virtual private network (VPN), an intranet, the Internet, a fiber optic-based network, and/or a combination of these or other types of networks. In embodiments, the network 230 may include copper transmission cables, optical transmission fibers, wireless transmission, routers, firewalls, switches, gateway computers and/or edge servers.

The quantity of devices and/or networks in the environment 200 is not limited to what is shown in FIG. 2. In practice, the environment 200 may include additional devices and/or networks; fewer devices and/or networks; different devices and/or networks; or differently arranged devices and/or networks than illustrated in FIG. 2. Also, in some implementations, one or more of the devices of the environment 200 may perform one or more functions described as being performed by another one or more of the devices of the environment 200. Devices of the environment 200 may interconnect via wired connections, wireless connections, or a combination of wired and wireless connections.

Figure 3:
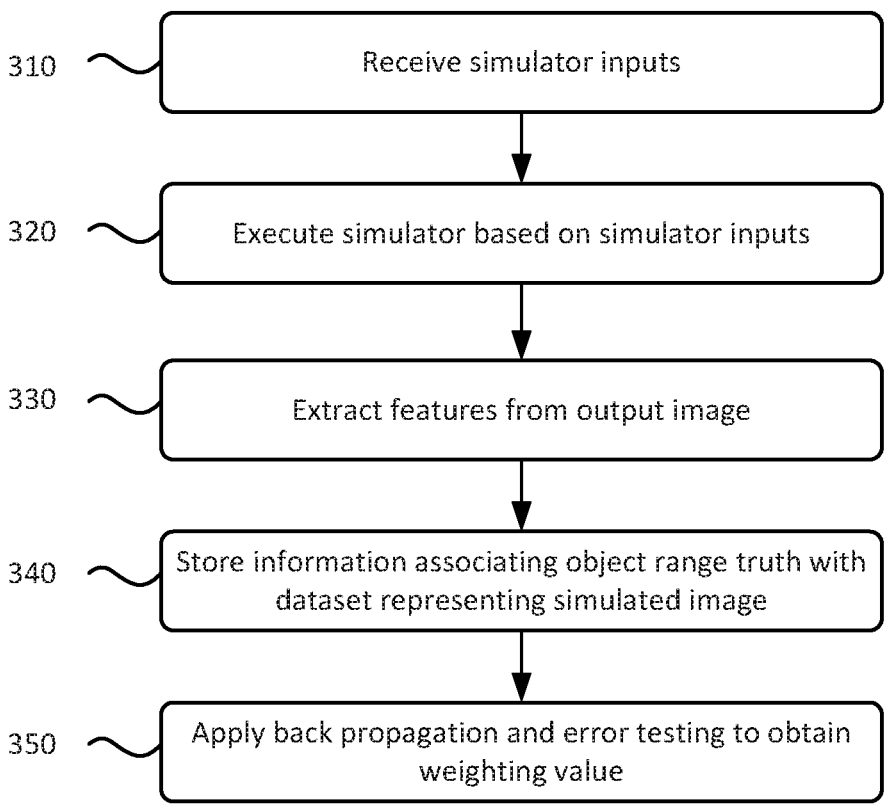
FIG. 3 shows an example flowchart of a process for generating training data to be used to train a predictor and/or neural network.

FIG. 3 shows an example flowchart of a process for generating training data to be used to train a predictor and/or neural network. The steps of FIG. 3 may be implemented in the environment of FIG. 2, for example, and are described using reference numbers of elements depicted in FIG. 2. As noted above, the flowchart illustrates the architecture, functionality, and operation of possible implementations of systems, methods, and computer program products according to various embodiments of the present disclosure.

As shown in FIG. 3, process 300 may include receiving simulator inputs (block 310). For example, the range determination system 220 may receive simulator inputs (e.g., in a similar manner as described above with respect to steps 1.1-1.3). In some implementations, the range determination system 220 may receive similar inputs, such as sensor attributes, observer environment parameters/sensor operating conditions, and object model data. In some implementations, the range determination system 220 may receive the simulator inputs from an operator and/or external system. Additionally, or alternatively, the simulator inputs may be iteratively and automatically generated. For example, different sets of sensor attributes and operating conditions of the sensor attributes may be generated (e.g., such that different sets of training data may be generated).

Process 300 may also include executing a simulator based on the simulator inputs (block 320). For example, the range determination system 220 may execute a simulator to generate a simulated image representing an image of an object that would be generated by a sensor 212 having the sensor attributes operating under the operating conditions (e.g., inputted at step 310).

Process 300 may further include extracting features from the output image (block 330). For example, the range determination system 220 may extract features in a similar manner as described above with respect to step 1.4. In some implementations, the range determination system 220 may extract features and attributes, such as observer position, observer attitude, object intensity, solar phase angle, or the like). Additionally, the object range truth is extracted. Alternatively, the object range truth may be predetermined.

Process 300 may also include storing information associating the object range truth with a dataset associated with the simulated image (block 340). For example, the range determination system 220 may store information that associates or links the object range truth with a dataset associated with the simulated image produced at block 320. More specifically, the range determination system 220 may store information that links the object range truth with the image, the extracted image features (e.g., extracted at block 330), and the simulator inputs (e.g., the sensor attributes, sensor operating conditions, etc.). As described herein, this training data may be stored to build and train a neural network and predictor.

Process 300 may further include applying back propagation and error testing to determine a weighting value (block 350). For example, the range determination system 220 may apply back propagation and error testing to determine a weighting value (e.g., in a similar manner as described above with respect to FIG. 1B). In some implementations, the range determination system 220 may store the weightings value (e.g., in the weights storage 226).

In some implementations, the training data may be used to build and train a neural network regression predictor. For example, process 300 may be repeated to simulate images and store training data of different objects when observed by different sensors having different types/attributes and operating under different conditions. More specifically, the range determination system 220 may store multiple different datasets, in which each dataset identifies image features, sensor attributes, sensor operating parameters, and/or other parameters. The range determination system 220 may store, in the form of a neural network, information linking each of the multiple datasets with object range truths. Further, the range determination system 220 may store weightings that may be applied for refining object range estimations.

Figure 4:
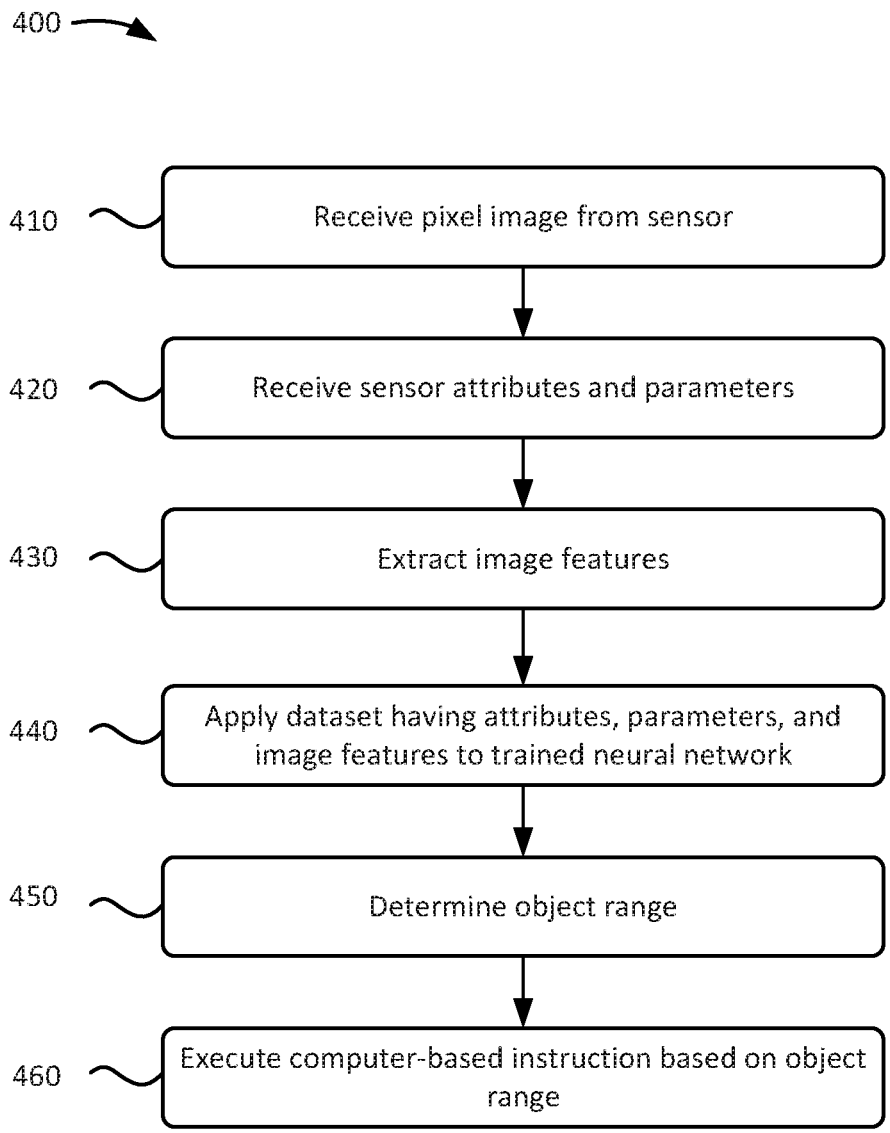
FIG. 4 shows an example flowchart of a process for using a trained neural network and predictor to determine range of an object relative to a sensor implemented within an observation system.

FIG. 4 shows an example flowchart of a process for using a trained neural network to determine range of an object relative to a sensor implemented within an observation system. The steps of FIG. 4 may be implemented in the environment of FIG. 2, for example, and are described using reference numbers of elements depicted in FIG. 2. As noted above, the flowchart illustrates the architecture, functionality, and operation of possible implementations of systems, methods, and computer program products according to various embodiments of the present disclosure.

As shown in FIG. 4, process 400 may include receiving a pixel image from a sensor (block 410). For example, the range determination system 220 may receive a pixel image (or an operational image) produced by a sensor 212 (e.g., during a live or real-time observation operation) and observed by the sensor 212 of the observation system 210. The pixel image may include an object observed by the sensor 212 of the observation system 210.

Process 400 may also include receiving sensor attributes and parameters (block 420). For example, the range determination system 220 may receive (e.g., from the observation system 210) attributes of the sensor 212 that observed the object and produced the image (e.g., at block 410). Also, the range determination system 220 may receive parameters and operating conditions under which the sensor 212 observed the object.

Process 400 may further include extracting image features (block 430). For example, the range determination system 220 may extract features, such as object intensity, solar phase angle, and/or other features associated with the image and/or the sensor 212.

Process 400 may also include applying a dataset having attributes, parameters, and image features to a trained neural network to (block 440). For example, the range determination system 220 may input the sensor attributes, parameters, and image features (e.g., obtained at block 410-430) into the neural network previously developed (e.g., using process 300). In some embodiments, the range determination system 220 may identify a particular set of weights to apply when predicting the range. For example, using equation 1 as an example illustration in which y is the range to be predicted, and x represents the dataset having attributes, parameters, and image features of the operational image, the range determination system 220 may identify the particular set of weights (e.g., m and B) to apply based on matching x associated with the operational image with a dataset from the simulated images having a substantially similar set of image features, attributes, parameters, etc.).

Process 400 may further include determining the object range (block 450). For example, the range determination system 220 may determine the object range using the neural network. In some implementations, the range determination system 220 may use the neural network along with the sensor attributes, parameters, and image features to predict a value representing the object's range. In other words, the range determination system 220 may determine, using the neural network, an object range that represents the sensor attributes, parameters, and image features. For example, the range determination system 220 may identify a particular dataset, of multiple datasets, in the neural network that substantially matches (e.g., within a threshold degree) the dataset including the sensor attributes, parameters, and image features. When a match is found, the range determination system 220 may identify the weights corresponding to the matched dataset. The range determination system 220 may apply the weightings to the neural network to adjust the predicted object range for a more accurate object range prediction. In some implementations, the range determination system 220 may output a value, a floating point represented as a decimal, or other information that represents the object range. In this way, the range determination system 220 may determine the range of the object in the image, produced by the sensor 212 of the observation system 210, using a trained neural network.

Process 400 may also include executing a computer-based instruction based on the object range (block 460). For example, the range determination system 220 may execute a computer-based instruction to output information identifying the object range. Additionally, or alternatively, the range determination system 220 may execute a computer-based instruction to save the object range for future use and analysis, or to track the object's trajectory. Additionally, or alternatively, the range determination system 220 may execute a computer-based instruction to generate an alert (e.g., based on the object's range being within a threshold, or the object's trajectory intersecting with another object).

Figure 5:
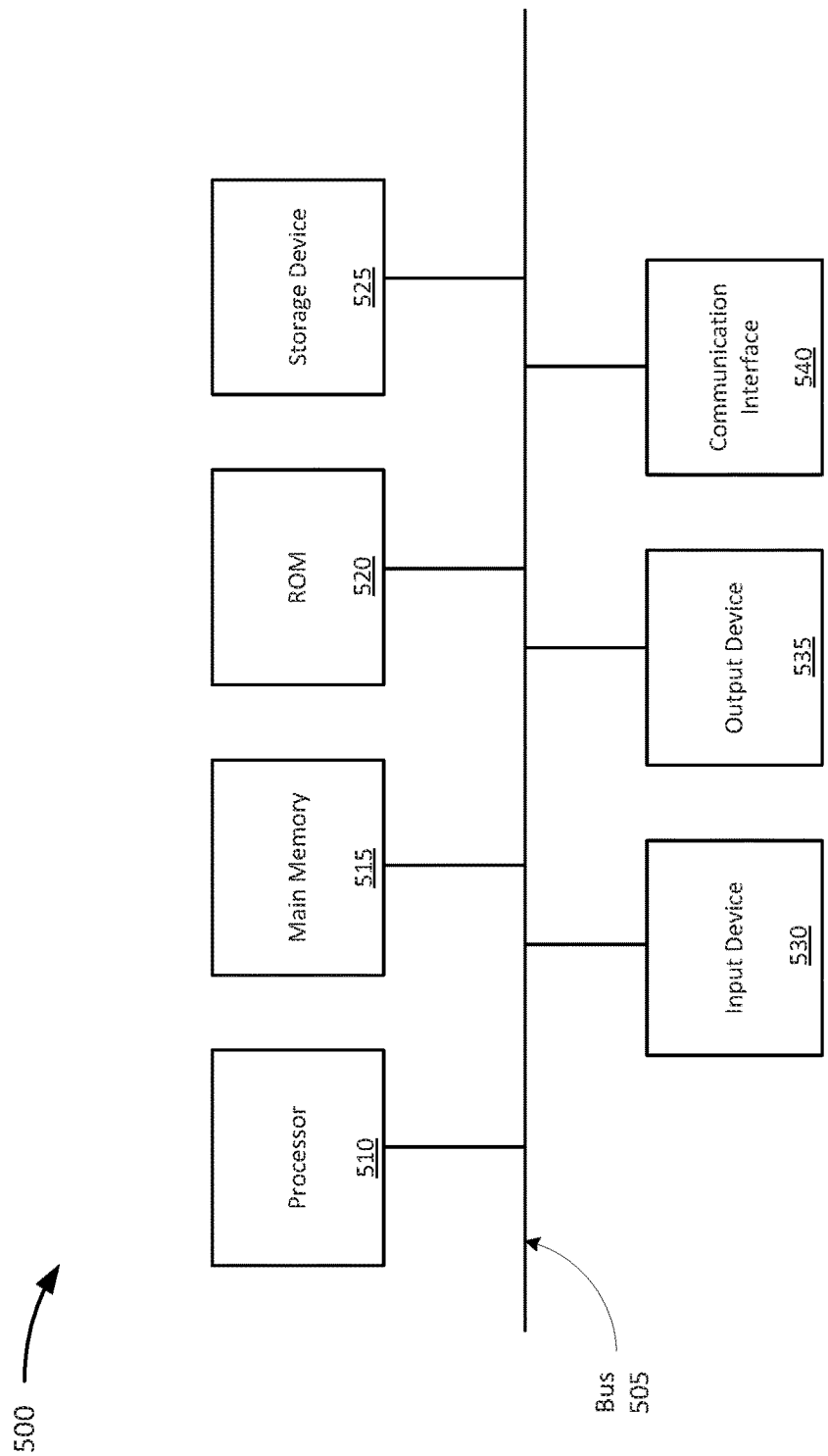
FIG. 5 illustrates example components of a device that may be used within environment of FIG. 2.

FIG. 5 illustrates example components of a device 500 that may be used within environment 200 of FIG. 2. Device 500 may correspond to the observation system 210 and/or the range determination system 220. Each of the observation system 210 and/or the range determination system 220 may include one or more devices 500 and/or one or more components of device 500.

As shown in FIG. 5, device 500 may include a bus 505, a processor 510, a main memory 515, a read only memory (ROM) 520, a storage device 525, an input device 530, an output device 535, and a communication interface 540.

Bus 505 may include a path that permits communication among the components of device 500. Processor 510 may include a processor, a microprocessor, an application specific integrated circuit (ASIC), a field programmable gate array (FPGA), or another type of processor that interprets and executes instructions. Main memory 515 may include a random access memory (RAM) or another type of dynamic storage device that stores information or instructions for execution by processor 510. ROM 520 may include a ROM device or another type of static storage device that stores static information or instructions for use by processor 510. Storage device 525 may include a magnetic storage medium, such as a hard disk drive, or a removable memory, such as a flash memory.

Input device 530 may include a component that permits an operator to input information to device 500, such as a control button, a keyboard, a keypad, or another type of input device. Output device 535 may include a component that outputs information to the operator, such as a light emitting diode (LED), a display, or another type of output device. Communication interface 540 may include any transceiver-like component that enables device 500 to communicate with other devices or networks. In some implementations, communication interface 540 may include a wireless interface, a wired interface, or a combination of a wireless interface and a wired interface. In embodiments, communication interface 540 may receiver computer readable program instructions from a network and may forward the computer readable program instructions for storage in a computer readable storage medium (e.g., storage device 525).

Device 500 may perform certain operations, as described in detail below. Device 500 may perform these operations in response to processor 510 executing software instructions contained in a computer-readable medium, such as main memory 515. A computer-readable medium may be defined as a non-transitory memory device and is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. A memory device may include memory space within a single physical storage device or memory space spread across multiple physical storage devices.

The software instructions may be read into main memory 515 from another computer-readable medium, such as storage device 525, or from another device via communication interface 540. The software instructions contained in main memory 515 may direct processor 510 to perform processes that will be described in greater detail herein. Alternatively, hardwired circuitry may be used in place of or in combination with software instructions to implement processes described herein. Thus, implementations described herein are not limited to any specific combination of hardware circuitry and software.

In some implementations, device 500 may include additional components, fewer components, different components, or differently arranged components than are shown in FIG. 5.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Embodiments of the disclosure may include a system, a method, and/or a computer program product at any possible technical detail level of integration. The computer program product may include a computer readable storage medium (or media) having computer readable program instructions thereon for causing a processor to carry out or execute aspects and/or processes of the present disclosure.

In embodiments, the computer readable program instructions may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on a user's computer, partly on the user's computer, as a stand-alone software package, partly on the user's computer and partly on a remote computer or entirely on the remote computer or server.

In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

In embodiments, a service provider could offer to perform the processes described herein. In this case, the service provider can create, maintain, deploy, support, etc., the computer infrastructure that performs the process steps of the disclosure for one or more customers. These customers may be, for example, any business that uses technology. In return, the service provider can receive payment from the customer(s) under a subscription and/or fee agreement and/ or the service provider can receive payment from the sale of advertising content to one or more third parties.

The foregoing description provides illustration and description, but is not intended to be exhaustive or to limit the possible implementations to the precise form disclosed. Modifications and variations are possible in light of the above disclosure or may be acquired from practice of the implementations.

It will be apparent that different examples of the description provided above may be implemented in many different forms of software, firmware, and hardware in the implementations illustrated in the figures. The actual software code or specialized control hardware used to implement these examples is not limiting of the implementations. Thus, the operation and behavior of these examples were described without reference to the specific software code—it being understood that software and control hardware can be designed to implement these examples based on the description herein.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

While the present disclosure has been disclosed with respect to a limited number of embodiments, those skilled in the art, having the benefit of this disclosure, will appreciate numerous modifications and variations there from. It is intended that the appended claims cover such modifications and variations as fall within the true spirit and scope of the disclosure.

No element, act, or instruction used in the present application should be construed as critical or essential unless explicitly described as such. Also, as used herein, the article "a" is intended to include one or more items and may be used interchangeably with "one or more." Where only one item is intended, the term "one" or similar language is used. Further, the phrase "based on" is intended to mean "based, at least in part, on" unless explicitly stated otherwise.

What is claimed is:

1. A computer-implemented method comprising:
   executing, by a computing device, a machine learning process to obtain information linking a dataset associated with a simulated image of an object with an object range truth;
   storing, by the computing device, the information linking the dataset associated with the simulated image of the object with the object range truth;
   receiving, by the computing device, an operational image from an observation system, wherein the operational image comprises the object;
   determining, by the computing device, a range of the object from the operational image based on the simulated image and the object range truth; and
   executing, by the computing device, a computer-based instruction based on the range of the object.

2. The computer-implemented method of claim 1, further comprising:
   receiving inputs to an image simulator, wherein the inputs comprise a model of an object;
   executing, based on the inputs, the image simulator to produce the simulated image, wherein the storing the information linking the dataset associated with the simulated image is based on producing the simulated image;
   producing a plurality of simulated image datasets based on a plurality of simulator input datasets;
   storing information linking respective object range truths with each of the plurality of simulated image datasets;
   extracting a dataset from the operational image;
   determining that the extracted dataset from the operational image substantially matches a particular simulated image dataset; and
   determining the range of the object from the operational image based on the object range truth associated with the particular simulated image dataset.

3. The computer-implemented method of claim 2, wherein the information linking the respective object range truths with each of the plurality of simulated image datasets is stored as part of a neural network.

4. The computer-implemented method of claim 2, wherein the inputs comprise at least one selected from one or more of:
   model data of the object;
   sensor attributes;
   observer environment parameters; or
   sensor operating parameters.

5. The computer-implemented method of claim 1, wherein the determining the range of the object is further based on a weighting.

6. The computer-implemented method of claim 5, wherein the weighting is determined based on back propagation.

7. The computer-implemented method of claim 1, wherein the computer-based instruction comprises at least one selected from one or more of:
- an instruction to output the range of the object for display;
- an instruction store the range of the object to track a trajectory of the object; or
- an instruction to output an alert.

8. A computer program product comprising a non-transitory computer readable storage medium having program instructions embodied therewith, the program instructions executable by a computing device to cause the computing device to:
- store a plurality of datasets linked to respective object range truths as part of executing a machine learning process for building a neural network;
- determine an object range of an object detected by a sensor and included in an operational image using the neural network; and
- execute a computer-based instruction based on the object range.

9. The computer program product of claim 8, wherein the building the neural network comprises:
- producing a plurality of simulated image datasets based on a plurality of simulator input datasets; and
- storing information linking the respective object range truths with each of the plurality of simulated image datasets.

10. The computer program product of claim 8, wherein the determining the object range comprises:
- determining that an extracted dataset from the operational image substantially matches a particular simulated image dataset; and
- determining the object range from the operational image based on the object range truth associated with the particular simulated image dataset.

11. The computer program product of claim 9, wherein the plurality of simulator input datasets comprise at least one selected from one or more of:
- model data of the object;
- sensor attributes;
- observer environment parameters; and
- sensor operating parameters.

12. The computer program product of claim 8, wherein the determining the object range is further based on a weighting.

13. The computer program product of claim 12, wherein the weighting is determined based on back propagation.

14. The computer program product of claim 8, wherein the computer-based instruction comprises at least one selected from one or more of:
- an instruction to output the object range for display;
- an instruction store the object range to track a trajectory of the object; or
- an instruction to output an alert.

15. A system comprising:
- a processor, a computer readable memory and a computer readable storage medium associated with a computing device;
- program instructions to receive an operational image from an observation system, wherein the operational image comprises an object;
- program instructions to extract a dataset from the operational image;
- program instructions to identify a particular dataset in a neural network that substantially matches the extracted dataset;
- program instructions to determine a range of the object from the operational image based on an object range truth associated with the particular dataset; and
- execute a computer-based instruction based on the range of the object,
- wherein the program instructions are stored on the computer readable storage medium for execution by the processor via the computer readable memory.

16. The system of claim 15, wherein the determining the range of the object is further based on a weighting.

17. The system of claim 16, wherein the weighting is determined based on back propagation.

18. The system of claim 15, wherein the extracted dataset comprises at least one selected from one or more of:
- model data of the object;
- sensor attributes;
- observer environment parameters; and
- sensor operating parameters.

19. The system of claim 15, wherein the computer-based instruction comprises at least one selected from one or more of:
- an instruction to output the range of the object for display;
- an instruction store the range of the object to track a trajectory of the object; or
- an instruction to output an alert.

20. The system of claim 15, wherein the observation system is implemented in a satellite.

* * * * *